(12) United States Patent
Mori et al.

(10) Patent No.: US 9,640,693 B2
(45) Date of Patent: May 2, 2017

(54) FLEXIBLE PRINTED WIRING BOARD AND PHOTOVOLTAIC MODULE

(71) Applicant: Sumitomo Electric Industries, Ltd., Osaka-shi (JP)

(72) Inventors: Koji Mori, Osaka (JP); Takashi Iwasaki, Osaka (JP); Youichi Nagai, Osaka (JP); Yoshiya Abiko, Osaka (JP); Rui Mikami, Osaka (JP); Kenji Saito, Osaka (JP); Makoto Inagaki, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 182 days.

(21) Appl. No.: 14/638,781

(22) Filed: Mar. 4, 2015

(65) Prior Publication Data
US 2015/0255655 A1    Sep. 10, 2015

(30) Foreign Application Priority Data

Mar. 6, 2014    (JP) .................................. 2014-043993

(51) Int. Cl.
*H01L 31/0224* (2006.01)
*H01L 31/05* (2014.01)
(Continued)

(52) U.S. Cl.
CPC ...... *H01L 31/0504* (2013.01); *H01L 31/0201* (2013.01); *H01L 31/052* (2013.01);
(Continued)

(58) Field of Classification Search
None
See application file for complete search history.

(56) References Cited

U.S. PATENT DOCUMENTS

2008/0264473 A1* 10/2008 Cumpston ....... H01L 31/035281
                                                              136/251
2008/0271777 A1* 11/2008 Stoner .................. G02B 6/0008
                                                              136/252

(Continued)

FOREIGN PATENT DOCUMENTS

JP    2006-005134 A    1/2006
JP    2007-112299 A    5/2007
(Continued)

OTHER PUBLICATIONS

Notification of Reasons for Rejection in Japanese Patent Application No. 2014-043993, dated Jan. 26, 2016.

*Primary Examiner* — Jayne Mershon
(74) *Attorney, Agent, or Firm* — Venable LLP; Michael A. Sartori; Laura G. Remus

(57) ABSTRACT

A flexible printed wiring board includes a first strip-shaped member and a second strip-shaped member each including a conductive part and an insulating part covering the conductive part; and a first connecting member including a conductive part and an insulating part covering the conductive part, the first connecting member connecting a first end of the first strip-shaped member and a first end of the second strip-shaped member to each other. The conductive parts of the first strip-shaped member, the second strip-shaped member, and the first connecting member are continuous with each other. The first strip-shaped member and the second strip-shaped member are capable of being linearly arranged when the first connecting member is bent and the first end of the first strip-shaped member and the first end of the second strip-shaped member face each other.

5 Claims, 12 Drawing Sheets

(51) Int. Cl.
*H05K 1/02* (2006.01)
*H01L 31/02* (2006.01)
*H01L 31/052* (2014.01)
*H01L 31/054* (2014.01)
*H05K 1/18* (2006.01)
*H05K 3/00* (2006.01)

(52) U.S. Cl.
CPC ...... *H01L 31/0508* (2013.01); *H01L 31/0512* (2013.01); *H01L 31/0543* (2014.12); *H05K 1/028* (2013.01); *H05K 1/189* (2013.01); *H05K 3/0052* (2013.01); *H05K 2201/055* (2013.01); *H05K 2201/10143* (2013.01); *Y02E 10/52* (2013.01)

(56) References Cited

U.S. PATENT DOCUMENTS

| | | | |
|---|---|---|---|
| 2011/0067751 A1* | 3/2011 | Meakin | H01L 31/048 136/251 |
| 2013/0160825 A1* | 6/2013 | Lantzer | H01L 31/0516 136/251 |

FOREIGN PATENT DOCUMENTS

| | | |
|---|---|---|
| JP | 2008-300527 A | 12/2008 |
| JP | 2013-080760 A | 5/2013 |
| WO | WO-2009/118935 A1 | 10/2009 |

* cited by examiner

A

B

C

A

B

C

FLEXIBLE PRINTED WIRING BOARD AND PHOTOVOLTAIC MODULE

BACKGROUND OF THE INVENTION

1. Field of the Invention

The present invention relates to a flexible printed wiring board and a photovoltaic module, and, in particular, to a flexible printed wiring board and a photovoltaic module that can be manufactured at low cost.

2. Description of the Related Art

For example, Japanese Unexamined Patent Application Publication No. 2013-80760 (Patent Document 1) describes the following technology. A concentrator photovoltaic module includes a tray-like housing having a bottom surface, a flexible printed wiring board disposed in contact with the bottom surface, and a primary concentrating part attached to the housing and in which a plurality of lens elements for concentrating sunlight are arranged. The flexible printed wiring board includes a flexible board and a plurality of power generating elements. The flexible board, having flexibility, includes an insulating base material that is insulating and a pattern that is conductive. The power generating elements are disposed on the flexible board so as to correspond one-to-one to the lens elements and so as be electrically connected to each other through the pattern.

PATENT DOCUMENT

[Patent Document 1] Japanese Unexamined Patent Application Publication No. 2013-80760
[Patent Document 2] Japanese Unexamined Patent Application Publication No. 2006-5134

The size of a flexible printed wiring board (which may be referred to as a flexible printed circuit (FPC)) is generally limited by the specifications of manufacturing equipment, such as exposure equipment. Therefore, for example, in order to use a long FPC for the photovoltaic module described in Japanese Unexamined Patent Application Publication No. 2013-80760, it is necessary to make an FPC having a desired length by connecting a plurality of FPCs to each other by, for example, soldering.

However, connection of FPCs by soldering tends to cause a decrease in product quality and an increase in manufacturing cost. Moreover, because conductors at soldered portions are exposed to the outside, it is also necessary to cover the soldered portions with a potting compound, such as a resin.

SUMMARY OF THE INVENTION

An object of the present invention, which has been made in order to solve the above problem, is to provide a flexible printed wiring board, with which long wiring can be easily realized by using existing manufacturing equipment, and a photovoltaic module including the flexible printed wiring board.

(1) In order to solve the above problem, a flexible printed wiring board according to an aspect of the present invention includes a first strip-shaped member and a second strip-shaped member each including a conductive part and an insulating part covering the conductive part; and a first connecting member including a conductive part and an insulating part covering the conductive part, the first connecting member connecting a first end of the first strip-shaped member and a first end of the second strip-shaped member to each other. The conductive part of the first strip-shaped member, the conductive part of the second strip-shaped member, and the conductive part of the first connecting member are continuous with each other. The first strip-shaped member and the second strip-shaped member are capable of being linearly arranged when the first connecting member is bent and the first end of the first strip-shaped member and the first end of the second strip-shaped member face each other.

(5) In order to solve the above problem, a photovoltaic module according to an aspect of the present invention includes a flexible printed wiring board, and a plurality of power generating elements mounted on the flexible printed wiring board. The flexible printed wiring board includes a first strip-shaped member and a second strip-shaped member each including a conductive part and an insulating part covering the conductive part; and a first connecting member including a conductive part and an insulating part covering the conductive part, the first connecting member connecting a first end of the first strip-shaped member and a first end of the second strip-shaped member to each other. The conductive part of the first strip-shaped member, the conductive part of the second strip-shaped member, and the conductive part of the first connecting member are continuous with each other. The first strip-shaped member and the second strip-shaped member are capable of being linearly arranged when the first connecting member is bent and the first end of the first strip-shaped member and the first end of the second strip-shaped member face each other. The conductive part of the first strip-shaped member, the conductive part of the second strip-shaped member, and the conductive part of the first connecting member electrically connect electrodes of the power generating elements to each other.

With the present invention, long wiring can be easily realized by using existing manufacturing equipment.

DESCRIPTION OF THE PREFERRED EMBODIMENTS

Figure 1:
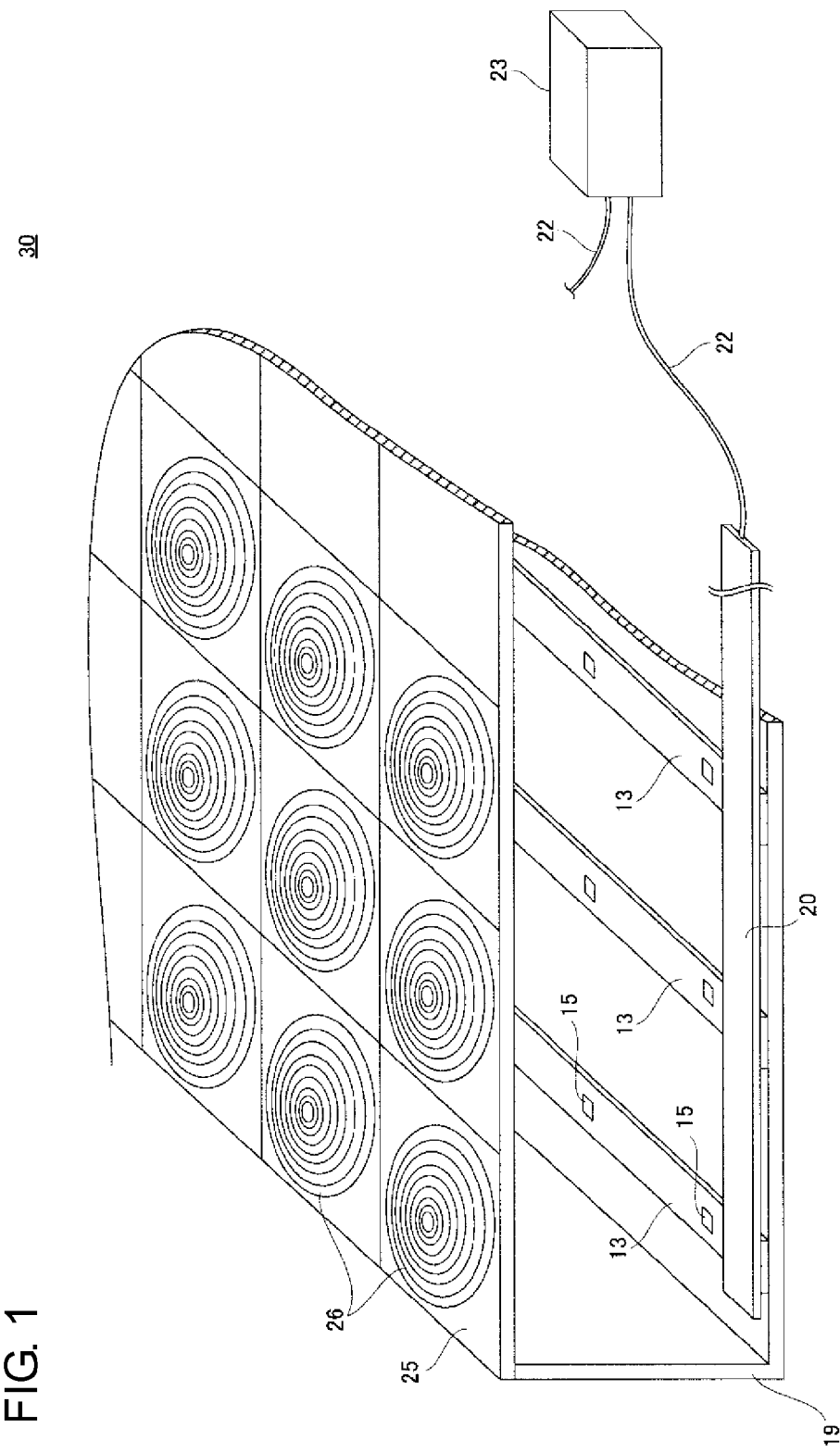
FIG. 1 illustrates the structure of a photovoltaic module according to a comparative example, which is to be compared with a photovoltaic module according to an embodiment of the present invention.

First, embodiments of the present invention will be described sequentially.

(1) A flexible printed wiring board according to an embodiment of the present invention includes a first strip-shaped member and a second strip-shaped member each including a conductive part and an insulating part covering the conductive part; and a first connecting member including a conductive part and an insulating part covering the conductive part, the first connecting member connecting a first end of the first strip-shaped member and a first end of the second strip-shaped member to each other. The conductive part of the first strip-shaped member, the conductive part of the second strip-shaped member, and the conductive part of the first connecting member are continuous with each other. The first strip-shaped member and the second strip-shaped member are capable of being linearly arranged when the first connecting member is bent and the first end of the first strip-shaped member and the first end of the second strip-shaped member face each other.

As describe above, the flexible printed wiring board according to the embodiment of the present invention has such a structure that, for example, the first strip-shaped member and the second strip-shaped member, which have been formed substantially parallel to each other, are extended into a linear shape. Thus, a long flexible printed wiring board can be made without connecting flexible printed wiring boards to each other by soldering or the like. Therefore, it is possible to reduce the cost of manufacturing a long flexible printed wiring board and to prevent a decrease in quality. Accordingly, long wiring can be easily realized by using existing manufacturing equipment.

With the flexible printed wiring board according to an embodiment of the present invention, for example, by locating the first connecting member on the front side of the first strip-shaped member and the second strip-shaped member, the entirety of the back surfaces of the first strip-shaped member and the second strip-shaped member can be disposed in close contact with the inside or the like of a housing. The distance between the first strip-shaped member and the second strip-shaped member can be finely adjusted while keeping the first strip-shaped member and the second strip-shaped member to be linearly arranged. Therefore, for example, it is possible to easily adjust the positions of electronic components mounted on the first strip-shaped member or the second strip-shaped member.

(2) Preferably, the flexible printed wiring board includes a plurality of sets of the first strip-shaped members, the second strip-shaped members, and the first connecting members; and a connection member connecting second ends of the first strip-shaped members to each other. The connection member includes a third strip-shaped member and a fourth strip-shaped member each including a conductive part and an insulating part covering the conductive part; and a second connecting member including a conductive part and an insulating part covering the conductive part, the second connecting member connecting a first end of the third strip-shaped member and a first end of the fourth strip-shaped member to each other. The conductive part of the third strip-shaped member, the conductive part of the fourth strip-shaped member, the conductive part of the second connecting member, and the conductive part of the first strip-shaped member are continuous with each other. The third strip-shaped member and the fourth strip-shaped member are capable of being linearly arranged when the second connecting member is bent and the first end of the third strip-shaped member and the first end of the fourth strip-shaped member face each other.

As described above, in the flexible printed wiring board according to the embodiment of the present invention, the second ends of the plurality of first strip-shaped members are connected to each other through the connection member, which is integrally formed with the first strip-shaped members. Thus, it is not necessary to additionally perform a soldering operation to connect the conductive parts of the first strip-shaped members to each other. As a result, it is possible to reduce the cost of manufacturing a flexible printed wiring board and to prevent a decrease in quality.

(3) More preferably, the connection member further includes a third connecting member including a conductive part and an insulating part covering the conductive part, the third connecting member connecting a second end of the first strip-shaped member and a second end of the third strip-shaped member to each other. The conductive part of the first strip-shaped member, the conductive part of the third connecting member, and the conductive part of the third strip-shaped member are connected to each other in this order. The third strip-shaped member is capable of being disposed substantially at right angles to the first strip-shaped member when the third strip-shaped member is bent.

As describe above, the third connecting member is employed in the flexible printed wiring board according to the embodiment of the present invention. With this structure, warping of the flexible printed wiring board due to twisting, which may occur when the third strip-shaped member and the fourth strip-shaped member are linearly arranged, is suppressed, and it is possible to make the entirety of the flexible printed wiring board be stably on the same plane or substantially on the same plane.

(4) More preferably, the flexible printed wiring board further includes an output member for connecting the connection member to another apparatus, the output member including a conductive part and an insulating part covering the conductive part. A conductive part of the connection member and the conductive part of the output member are continuous with each other.

The flexible printed wiring board according to the embodiment of the present invention, having the above structure, can be connected to another apparatus without additionally connecting lead wires. Therefore, it is possible to reduce the manufacturing cost and to prevent a decrease in quality.

(5) A photovoltaic module according to an embodiment of the present invention includes a flexible printed wiring board, and a plurality of power generating elements mounted on the flexible printed wiring board. The flexible printed wiring board includes a first strip-shaped member and a second strip-shaped member each including a conductive part and an insulating part covering the conductive part; and a first connecting member including a conductive part and an insulating part covering the conductive part, the first connecting member connecting a first end of the first strip-shaped member and a first end of the second strip-shaped member to each other. The conductive part of the first strip-shaped member, the conductive part of the second strip-shaped member, and the conductive part of the first connecting member are continuous with each other. The first strip-shaped member and the second strip-shaped member are capable of being linearly arranged when the first connecting member is bent and the first end of the first strip-shaped member and the first end of the second strip-shaped member face each other. The conductive part of the first strip-shaped member, the conductive part of the second strip-shaped member, and the conductive part of the first connecting member electrically connect electrodes of the power generating elements to each other.

As describe above, the flexible printed wiring board according to the embodiment of the present invention has such a structure that, for example, the first strip-shaped member and the second strip-shaped member, which have been formed substantially parallel to each other, are extended into a linear shape. Thus, a long flexible printed wiring board can be made without connecting flexible printed wiring boards to each other by soldering or the like. Therefore, it is possible to reduce the cost of manufacturing a long flexible printed wiring board and to prevent a decrease in quality. Accordingly, long wiring can be easily realized by using existing manufacturing equipment.

For example, by locating the first connecting member on the front side of the first strip-shaped member and the second strip-shaped member, the entirety of the back surfaces of the first strip-shaped member and the second strip-shaped member can be disposed in contact with the bottom of the housing of the photovoltaic module. Therefore, it is possible to equalize the distance between the power generating elements, which are disposed on the front side of the first strip-shaped member and the second strip-shaped member, and Fresnel lenses, which are disposed so as to be parallel to the bottom of the housing. Moreover, by making the entirety of the back surfaces of the first strip-shaped member and the second strip-shaped member be in contact with the bottom of the housing of the photovoltaic module, it is possible to dissipate heat generated by sunlight in the power generating elements and to maintain high energy conversion efficiency from sunlight to electric power.

The distance between the first strip-shaped member and the second strip-shaped member can be finely adjusted while keeping the first strip-shaped member and the second strip-shaped member to be linearly arranged. Therefore, for example, it is possible to easily adjust the positions of the power generating elements mounted on the first strip-shaped member and the second strip-shaped member with those of the Fresnel lenses disposed above the power generating elements.

Hereinafter, an embodiment of the present invention will be described with reference to the drawings. Elements in the drawings that are the same or equivalent to each other are denoted by the same numerals and redundant descriptions of such elements will be omitted. Parts of the embodiment described below may be used in any appropriate combination.

First Embodiment

Comparative Example

FIG. 1 illustrates the structure of a photovoltaic module according to a comparative example, which is to be compared with a photovoltaic module according to an embodiment of the present invention.

Referring to FIG. 1, a photovoltaic module 30 is, for example, a concentrator photovoltaic module. The photovoltaic module 30 includes a plurality of FPCs 13, a plurality of power generating elements 15, a housing 19, a bus bar 20, two connection leads 22, a junction box 23, and a concentrating part 25. The concentrating part 25 includes a plurality of Fresnel lenses 26.

The housing 19 holds the concentrating part 25 on edges thereof so that the Fresnel lenses 26 are parallel to and separated by a predetermined distance from a bottom thereof.

For example, the FPCs 13 are arranged on the bottom of the housing 19 substantially parallel to each other. The plurality of power generating elements 15 are mounted on each of the FPCs 13.

In the concentrating part 25, the Fresnel lenses 26 are arranged in a matrix pattern. The Fresnel lenses 26 correspond one-to-one to the power generating elements 15 and concentrate, for example, sunlight onto the power generating elements 15.

Each power generating element 15 is located on the optical axis of a corresponding one of the Fresnel lenses 26 and receives sunlight concentrated by the Fresnel lens 26. The power generating element 15 generates electric power in accordance with the amount of received light.

Each Fresnel lens 26 has a size of, for example, 50 mm×50 mm. Each power generating element 15 has a size of, for example, 3.2 mm×3.2 mm.

An end of each FPC 13 is connected to the bus bar 20. The bus bar 20 is connected to a terminal of the junction box 23 through one of the connection leads 22. The junction box 23 is, for example, a small relay box that connects the plurality of photovoltaic modules 30 to each other.

The photovoltaic module 30 outputs electric power, which is generated by the power generating elements 15, through the junction box 23. The bus bar 20 is made of, for example, copper. Parts of the bus bar 20 other than those that are connected to the FPCs 13 and the connection leads 22 are covered with an insulator, such as a resin.

Figure 2:
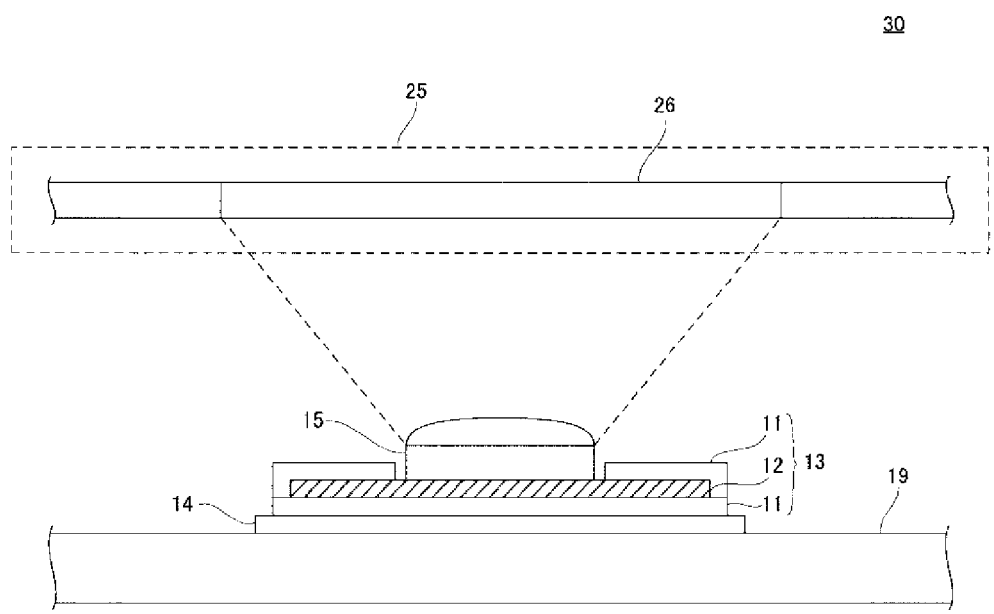
FIG. 2 is a cross-sectional view of the photovoltaic module according to the comparative example.
Figure 3:
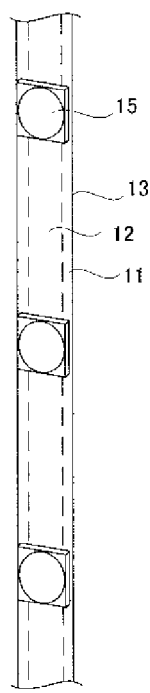
FIG. 3 illustrates an FPC of a photovoltaic module according to the comparative example and power generating elements mounted on the FPC.

FIG. 2 is cross-sectional view of the photovoltaic module 30 according to the comparative example. FIG. 3 illustrates one of the FPCs 13 of the photovoltaic module 30 according to the comparative example and the power generating elements 15 mounted on the FPC 13.

Referring to FIGS. 2 and 3, the photovoltaic module 30 includes the FPCs 13, a reinforcing plate 14, the power generating elements 15, the housing 19, and the concentrating part 25. Each FPC 13 includes an insulating part 11 and a conductive part 12. The concentrating part 25 includes the Fresnel lenses 26.

The conductive part 12 is, for example, a wiring pattern of a copper foil, and serially connects the power generating elements 15 mounted on the FPC 13. The insulating part 11 is, for example, a polyimide insulating film and covers the conductive part 12. In the conductive part 12, the power generating elements 15 need not be serially connected but may be parallelly connected to each other.

The reinforcing plate 14 is bonded to the back side of the FPC 13 so that the FPC 13 can have some rigidity while maintaining flexibility. For example, the reinforcing plate 14 facilitates handling of the FPC 13 when manufacturing the photovoltaic module 30.

The housing 19 and the reinforcing plate 14 are made of, for example, aluminum. The photovoltaic module 30 may have a structure without the reinforcing plate 14.

Figure 4:
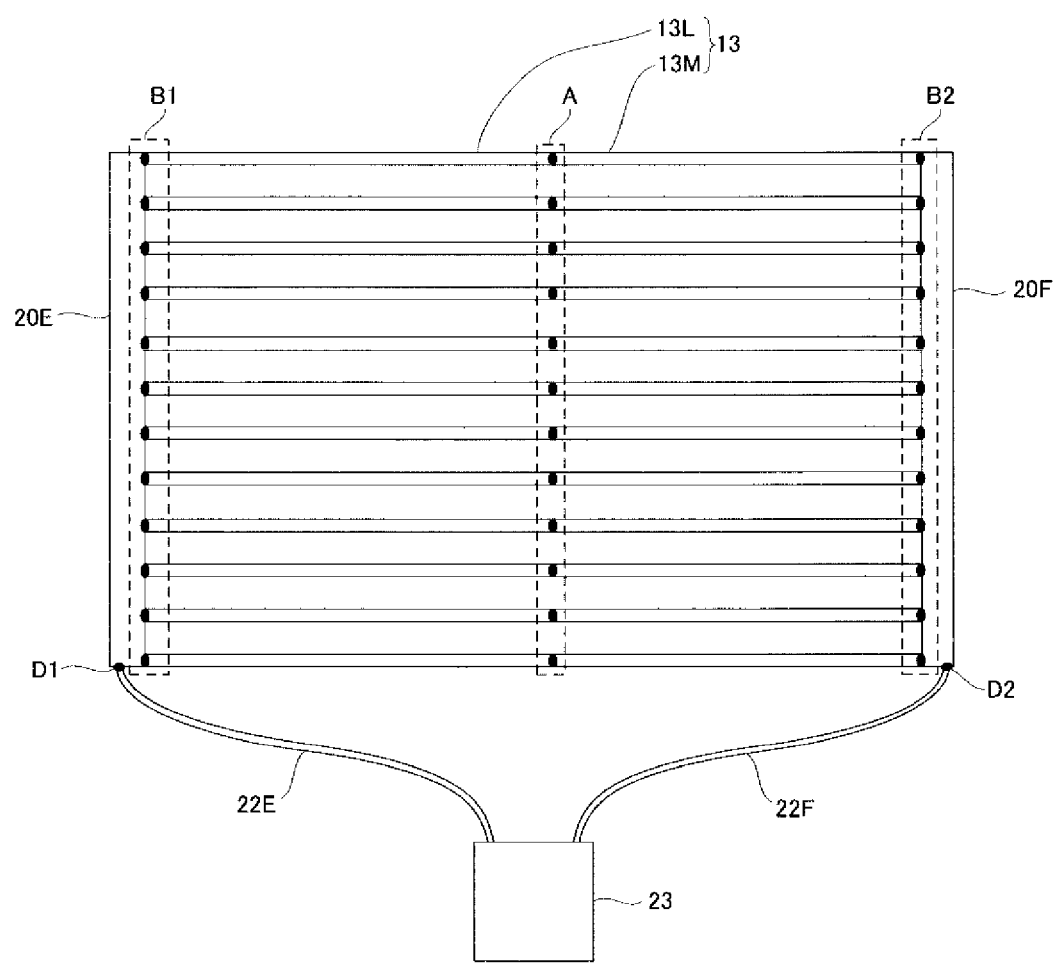
FIG. 4 illustrates how parts of the photovoltaic module according to the comparative example are connected to each other.

FIG. 4 illustrates how parts of the photovoltaic module 30 according to the comparative example are connected to each other.

Referring to FIG. 4, the photovoltaic module 30 includes, for example, twelve FPCs 13, a bus bar 20E, a bus bar 20F, a connection lead 22E, a connection lead 22F, and the junction box 23.

Each FPC 13 includes an FPC 13L and an FPC 13M. Each FPC 13L and a corresponding one of the FPCs 13M are connected to each other by, for example, soldering at positions in a region A.

In general, the size of an FPC is limited by the specifications of manufacturing equipment, such as exposure equipment. Therefore, in order to use a long FPC 13, it is necessary to make the FPC 13 by connecting a plurality of FPCs.

The FPCs 13 are connected to the bus bar 20E by, for example, soldering at positions in a region B1. The FPCs 13 are connected to the bus bar 20F by, for example, soldering at positions in a region B2. The FPCs 13 are parallelly connected through two bus bars 20E and 20F.

The connection lead 22E is connected to the bus bar 20E by, for example, soldering at a position D1. The connection lead 22F is connected to the bus bar 20F by, for example, soldering at a position D2.

The two bus bars 20E and 20F of the photovoltaic module 30 are connected to the junction box 23 through the connection leads 22E and 22F, respectively.

Soldering at the positions in the regions A, B1, and B2, and the positions D1 and D2 are performed by using, for example, a soldering iron. Because conductors at soldered portions are exposed to the outside, the soldered portions need to be covered with a potting compound.

However, it is difficult to achieve a uniform finish in a soldering operation using a soldering iron and in a potting operation. Therefore, the quality of a product is likely to decrease. Moreover, the manufacturing cost is likely to increase, because such operations may be time-consuming.

Therefore, with a photovoltaic module according to the embodiment of the present invention, the number of positions at which a soldering operation using soldering iron or a potting operation is to be performed is maximally reduced. As a result, the product quality is increased and the cost is reduced.

For example, regarding the FPC 13, a long FPC can be obtained, without the need for soldering, by folding back and extending an angular U-shaped FPC, which has been manufactured by using ordinary manufacturing equipment, into a linear shape. In this case, for example, the positions in the region A illustrated in FIG. 4A correspond to foldback portions of the FPC.

Moreover, for example, by integrally forming the bus bars 20E and 20F and the connection leads 22E and 22F with the FPCs 13, soldering portions can be eliminated.

In the photovoltaic module according the embodiment of the present invention, an integrally formed flexible printed wiring board is used instead of the plurality of FPCs 13, the two bus bars 20E and 20F, and the two connection leads 22E and 22F.

Structure of Flexible Printed Wiring Board

Figure 5:
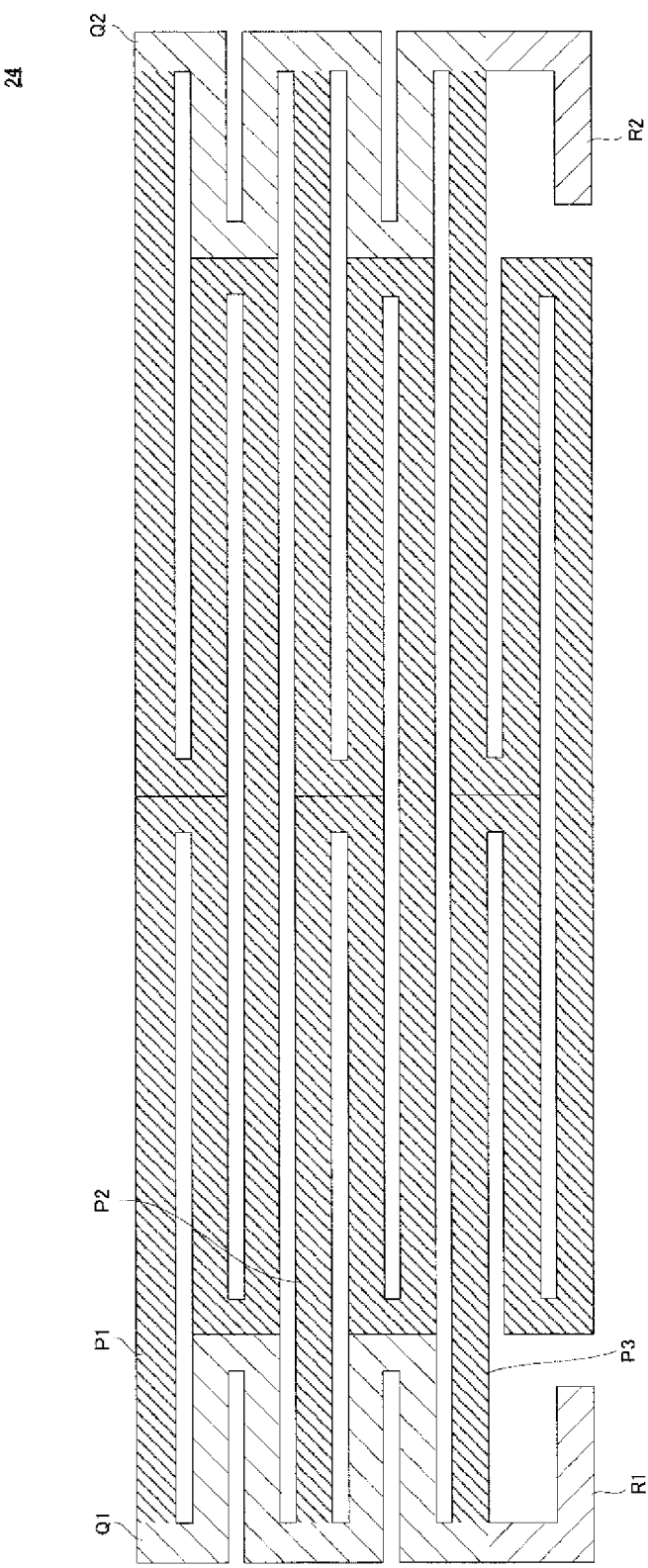
FIG. 5 is a top view illustrating the shape of a flexible printed wiring board according to an embodiment of the present invention.
Figure 6:
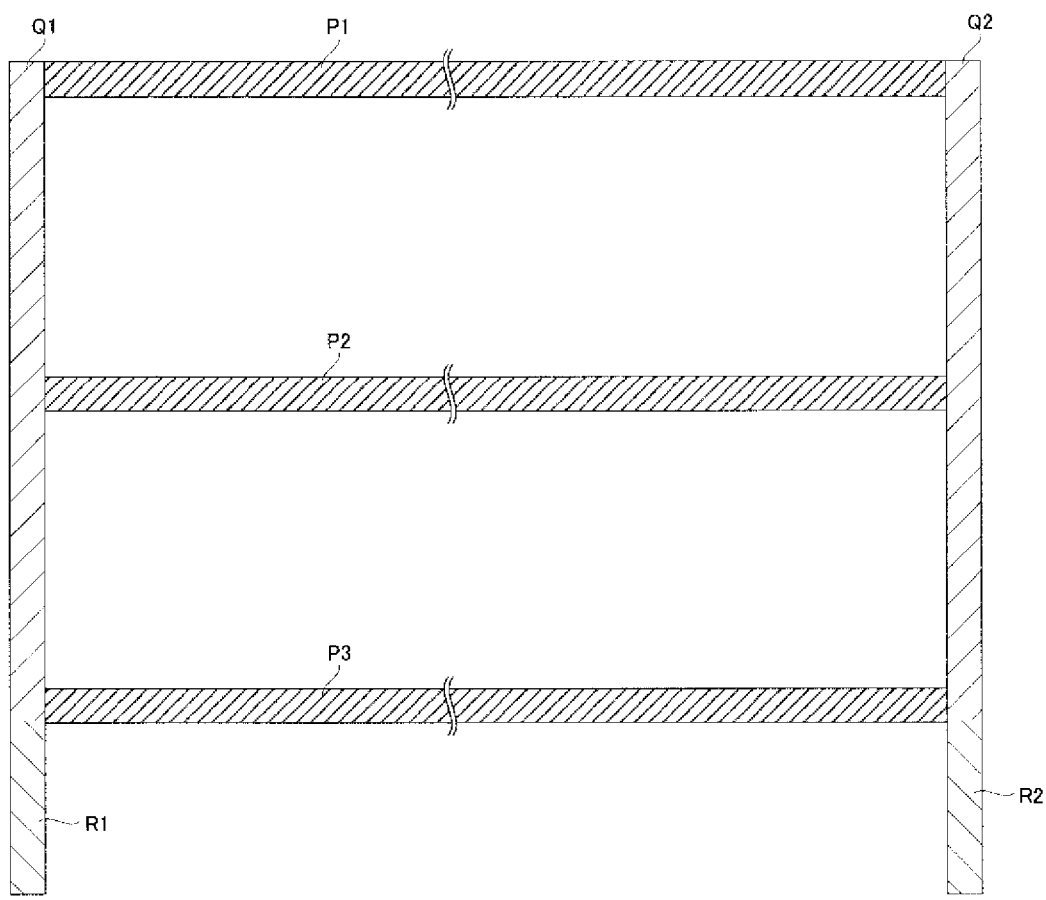
FIG. 6 is a top view illustrating the shape of the flexible printed wiring board shown in FIG. 5 in an extended state.

FIG. 5 is a top view illustrating the shape of a flexible printed wiring board 24 according to an embodiment of the present invention. FIG. 6 is a top view illustrating the shape of the flexible printed wiring board shown in FIG. 5 in an extended state.

Referring to FIGS. 5 and 6, the flexible printed wiring board 24 includes a plurality of strip-shaped members, which are integrally formed. In the flexible printed wiring board 24, portions P1 to P3, portions Q1 and Q2, and portions R1 and R2 shown in FIG. 5 respectively correspond to portions P1 to P3, portions Q1 and Q2, and portions R1 and R2 shown in FIG. 6.

The flexible printed wiring board 24 includes members corresponding to the three FPCs 13 shown in FIG. 1, members corresponding to the two bus bars 20 shown in FIG. 1, and members corresponding to the two connection leads 22 shown in FIG. 1.

To be specific, for example, the portions P1 to P3 of the flexible printed wiring board 24 respectively correspond to the FPCs 13 shown in FIG. 1. For example, the portions Q1 and Q2 respectively correspond to the bus bars 20 shown in FIG. 1. For example, the portions R1 and R2 respectively correspond to the connection leads 22 shown in FIG. 1.

Each of the portions P1 to P3, the portions Q1 and Q2, and the portions R1 and R2 includes a conductive part 12 and an insulating part 11 covering the conductive part 12. The conductive parts 12 are continuous with each other at positions at which these parts are connected to each other.

Figure 7:
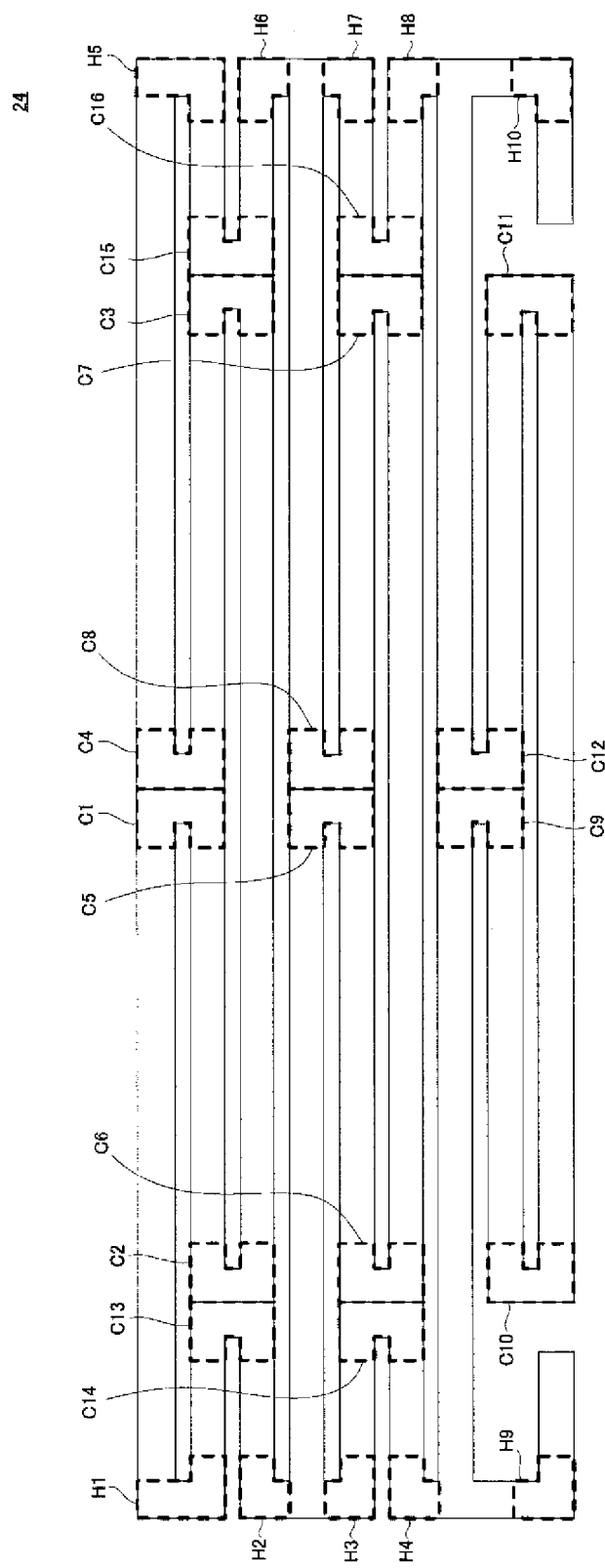
FIG. 7 illustrates how parts of the flexible printed wiring board shown in FIG. 5 are extended.

FIG. 7 illustrates how the portions of the flexible printed wiring board shown in FIG. 5 are extended.

Referring to FIGS. 6 and 7, portions C1 to C16 of the flexible printed wiring board 24 are each extended into a linear shape. Portions H1 to H10 are each extended into a linear shape.

Figure 8:
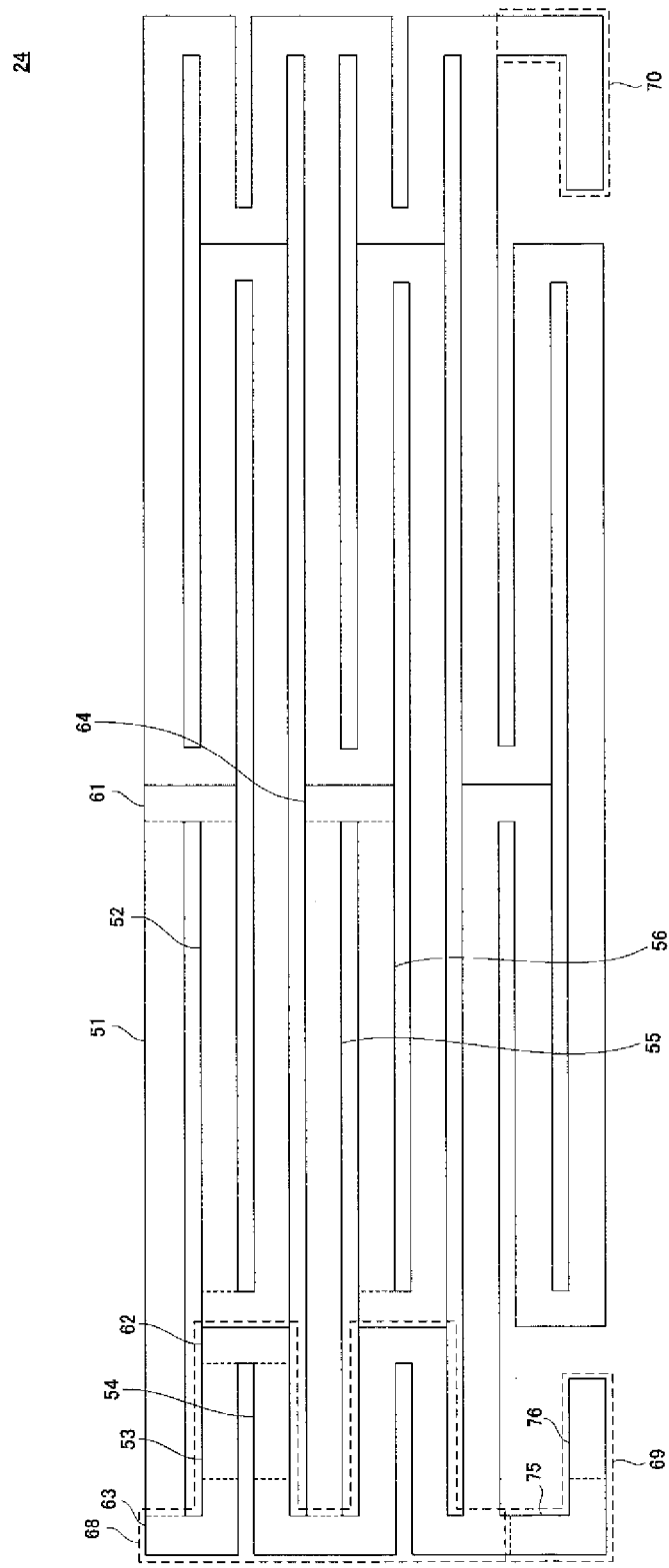
FIG. 8 illustrates the structure of the flexible printed wiring board according to the embodiment of the present invention.

FIG. 8 illustrates the structure of the flexible printed wiring board according to the embodiment of the present invention. In FIG. 8, representative portions of the flexible printed wiring board 24 are indicated by numerals.

Referring to FIG. 8, the flexible printed wiring board 24 includes a strip-shaped member 51 (first strip-shaped member), a strip-shaped member 52 (second strip-shaped member), a strip-shaped member 55 (first strip-shaped member), a strip-shaped member 56 (second strip-shaped member), a connecting member 61 (first connecting member), a connecting member 64 (first connecting member), a connection member 68, an output member 69, and an output member 70.

The connection member 68 includes a strip-shaped member 53 (third strip-shaped member), a strip-shaped member 54 (fourth strip-shaped member), a connecting member 62 (second connecting member), and a connecting member 63 (third connecting member). The output member 69 includes a connecting member 75 and a strip-shaped member 76.

The connection member 68 corresponds to the portion Q1 in FIG. 5. The output member 69 and the output member 70 respectively correspond to the portion R1 and the portion R2 in FIG. 5.

The strip-shaped member 51 includes a first end connected to the connecting member 61 and a second end connected to the connection member 68. The strip-shaped member 52 includes a first end connected to the connecting member 61 and a second end, which is the other end.

The strip-shaped member 55 includes a first end connected to the connecting member 64 and a second end connected to the connection member 68. The strip-shaped member 56 includes a first end connected to the connecting member 64 and a second end, which is the other end. The connection member 68 connects the second end of the strip-shaped member 51 and the second end of the strip-shaped member 55 to each other.

The strip-shaped member 53 includes a first end connected to the connecting member 62 and a second end connected to the connecting member 63. The strip-shaped member 54 includes a first end connected to the connecting member 62 and a second end, which is the other end.

Figure 9:
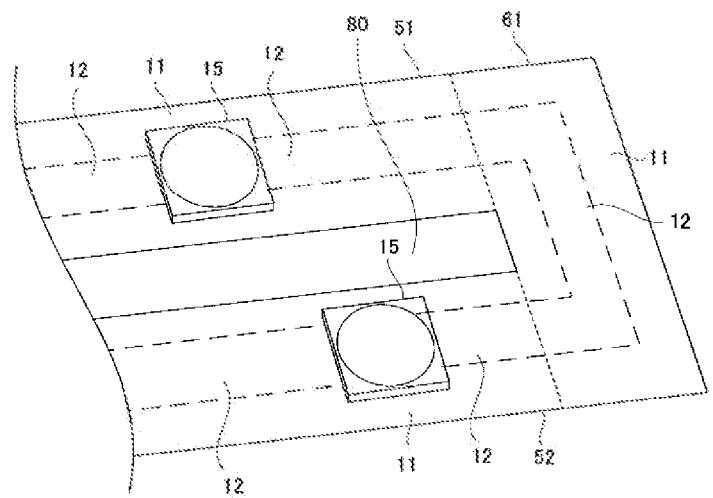
FIG. 9 illustrate the process of linearly extending a first strip-shaped member and a second strip-shaped member of the flexible printed wiring board according to the embodiment of the present invention.
Figure 9:
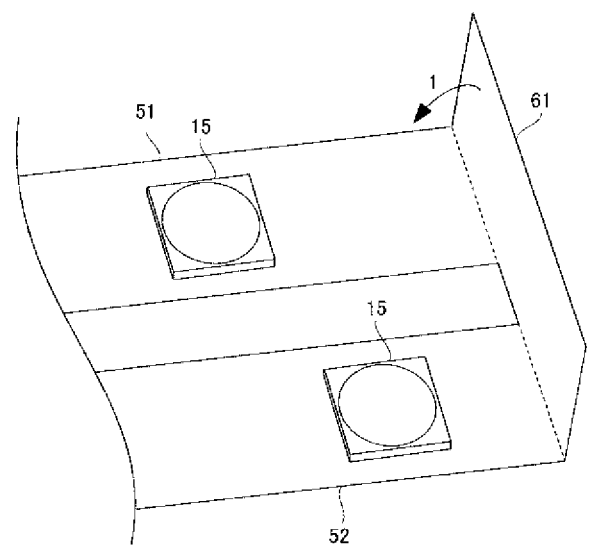
Figure 9:
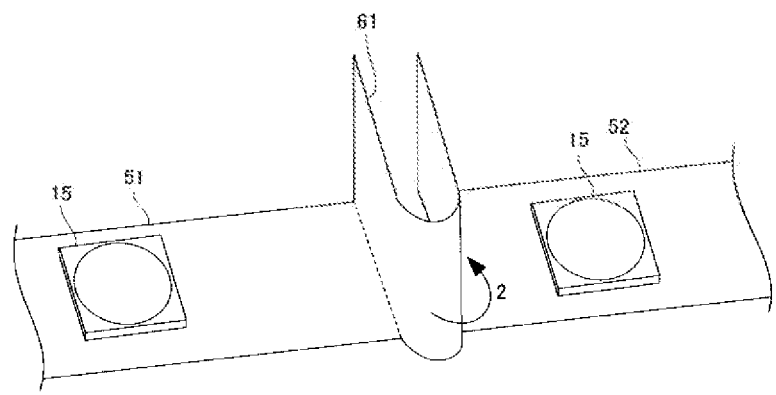

FIG. 9 illustrate the process of linearly extending a first strip-shaped member and a second strip-shaped member of the flexible printed wiring board according to the embodiment of the present invention.

In FIG. 9, A illustrates a state before the strip-shaped member 51 and the strip-shaped member 52 are extended into a linear shape. In FIG. 9, B illustrates a state in which the strip-shaped member 51 and the strip-shaped member 52 are being extended into a linear shape. In FIG. 9, C illustrates a state in which the strip-shaped member 51 and the strip-shaped member 52 have been extended into a linear shape.

Referring to FIG. 9, A shows that the connecting member 61 connects the first end of the strip-shaped member 51 and the first end of the strip-shaped member 52 to each other. Each of the strip-shaped member 51, the strip-shaped member 52, and the connecting member 61 includes a conductive part 12 and an insulating part 11 covering the conductive part 12.

The conductive part 12 of the strip-shaped member 51, the conductive part 12 of the strip-shaped member 52, and the conductive part 12 of the connecting member 61 are continuous with each other. To be specific, for example, the conductive parts 12 are continuous with each other at a position near the boundary between the strip-shaped member 51 and the connecting member 61. Moreover, the conductive parts 12 are continuous with each other at a position near the boundary between the strip-shaped member 52 and the connecting member 61.

Power generating elements 15 are mounted on each of the strip-shaped member 51 and the strip-shaped member 52. The conductive part 12 of the strip-shaped member 51, the conductive part 12 of the strip-shaped member 52, and the conductive part 12 of the connecting member 61 connect electrodes of the power generating element 15 to each other.

Before being extended, the strip-shaped member 51 and the strip-shaped member 52 are located substantially parallel to each other. Preferably, the term "substantially parallel" means that these members form an angle in the range of 180±5°.

Referring to FIG. 9, B shows that the connecting member 61 is bent, for example, at a position near the boundary between the strip-shaped member 51 and the strip-shaped member 52 in a direction toward the strip-shaped member 51 and the strip-shaped member 52, that is, in the direction of arrow 1. Thus, the connecting member 61 stands on the strip-shaped member 51 and the strip-shaped member 52. Preferably, the term "stand" means that the connecting member 61 and strip-shaped members 51, 52 form an angle in the range of 90±30°.

Referring to FIG. 9, C shows that the connecting member 61 is bent, for example, in such a direction that the strip-shaped member 52 is rotated away from the strip-shaped member 51, that is, in the direction of arrow 2. As a result, the strip-shaped member 51 and the strip-shaped member 52 are linearly arranged. In this state, the connecting member 61 may be curved or bent.

Thus, when the connecting member 61 is bent, the first end of the strip-shaped member 51 and the first end of the strip-shaped member 52 face each other with the connecting member 61 therebetween, and the strip-shaped member 51 and the strip-shaped member 52 are linearly arranged.

The strip-shaped member 51 and the strip-shaped member 52 need not be linearly arranged. To be specific, for example, the strip-shaped member 51 and the strip-shaped member 52 may be arranged so as to form a predetermined angle therebetween, the predetermined angle being an angle between that of an arrangement shown in B of FIG. 9 and that of an arrangement shown in C of FIG. 9.

Each set of members that are connected in each of the portions C2 to C12 shown in FIG. 7 are extended in the same way as the set of members connected in the portion C1, that is, the strip-shaped member 51, the strip-shaped member 52, and the connecting member 61 shown in FIG. 8 are extended. For example, the set of the strip-shaped member 55, the strip-shaped member 56, and the connecting member 64, which are connected in the portion C5, are extended in the same way as the strip-shaped member 51, the strip-shaped member 52, and the connecting member 61, which are connected in the portion C1, are extended, and the strip-shaped member 55 and the strip-shaped member 56 are linearly arranged.

Referring back to FIG. 9, A shows that a portion including the strip-shaped member 51, the strip-shaped member 52, and the connecting member 61 can be regarded as a single strip-shaped member (which may be referred to as a slit strip-shaped member), in which a slit 80 is formed between the strip-shaped member 51 and the strip-shaped member 52.

In this case, a conductive part 12 is disposed in the slit strip-shaped member so as to surround the slit 80.

Referring back to FIG. 9, B shows that the slit strip-shaped member is bent from a position near an end of the slit 80 in a direction toward the strip-shaped member 51 and the strip-shaped member 52, that is, in the direction of arrow 1.

Referring back to FIG. 9, C shows that the strip-shaped member 51 and the strip-shaped member 52, which are located on both sides of the slit 80, are rotated in opposite directions around the end of the slit until the strip-shaped member 51 and the strip-shaped member 52 are linearly arranged. Thus, the length of the slit strip-shaped member is increased from that of an arrangement before the strip-shaped member 51 and the strip-shaped member 52 are rotated, that is, those of arrangements shown in A and B of FIG. 9.

Figure 10:
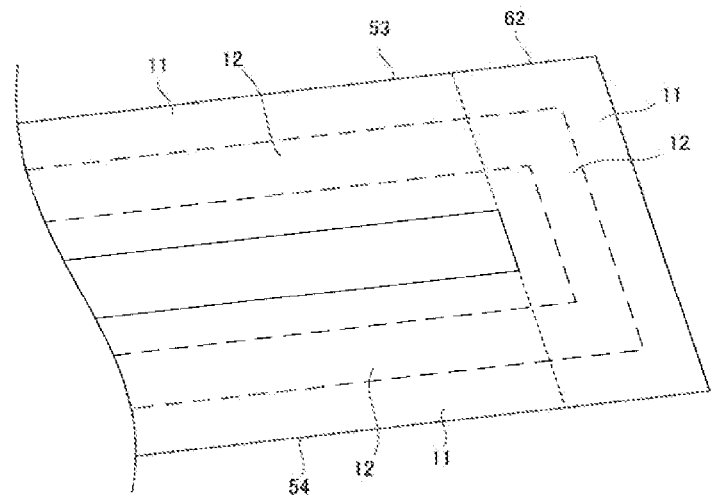
FIG. 10 illustrate the process of linearly extending a third strip-shaped member and a fourth strip-shaped member of the flexible printed wiring board of the flexible printed wiring board according to the embodiment of the present invention.
Figure 10:
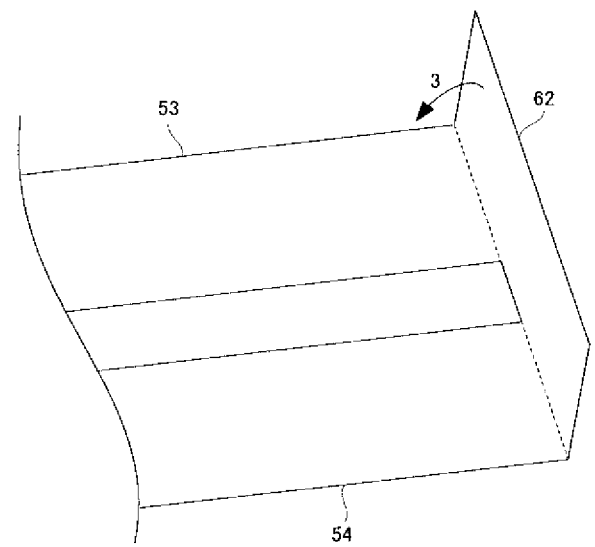
Figure 10:
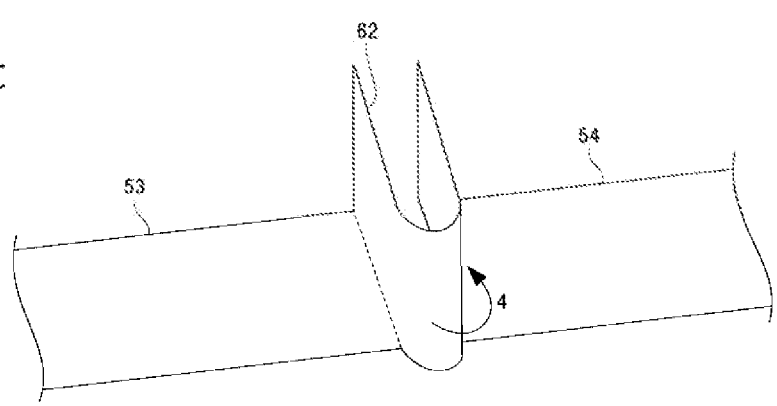

FIG. 10 illustrate the process of linearly extending a third strip-shaped member and a fourth strip-shaped member of the flexible printed wiring board according to the embodiment of the present invention.

In FIG. 10, A illustrates a state before the strip-shaped member 53 and the strip-shaped member 54 are extended into a linear shape. In FIG. 10, B illustrates a state in which the strip-shaped member 53 and the strip-shaped member 54 are being extended into a linear shape. In FIG. 10, C illustrates a state in which the strip-shaped member 53 and the strip-shaped member 54 have been extended into a linear shape.

Referring to FIG. 10, A shows that the connecting member 62 connects the first end of the strip-shaped member 53 and the first end of the strip-shaped member 54 to each other.

Each of the strip-shaped member 53, the strip-shaped member 54, and the connecting member 62 includes a conductive part 12 and an insulating part 11 covering the conductive part 12.

The conductive part 12 of the strip-shaped member 53, the conductive part 12 of the strip-shaped member 54, the conductive part 12 of the connecting member 62, and the conductive part 12 of the strip-shaped member 51 shown in FIG. 8 are continuous with each other. Before being extended, the strip-shaped member 53 and the strip-shaped member 54 are located substantially parallel to each other.

Referring to FIG. 10, B shows that the connecting member 62 is bent, for example, at a position near the boundary between the strip-shaped member 53 and the strip-shaped member 54 in a direction toward the strip-shaped member 53 and the strip-shaped member 54, that is, in the direction of arrow 3. Thus, the connecting member 62 stands on the strip-shaped member 53 and the strip-shaped member 54. Preferably, the term "stands" means that the connecting member 62 and strip-shaped members 53, 54 form an angle in the range of 90±30°.

Referring to FIG. 10, C shows that the connecting member 62 is bent, for example, in such a direction that the strip-shaped member 54 is rotated away from the strip-shaped member 53, that is, in the direction of arrow 4. As a result, the strip-shaped member 53 and the strip-shaped member 54 are linearly arranged. In this state, the connecting member 62 may be curved or bent.

Thus, when the connecting member 62 is bent, the first end of the strip-shaped member 53 and the first end of the strip-shaped member 54 face each other with the connecting member 62 therebetween, and the strip-shaped member 53 and the strip-shaped member 54 are linearly arranged.

The strip-shaped member 53 and the strip-shaped member 54 need not be linearly arranged. To be specific, for example, the strip-shaped member 53 and the strip-shaped member 54 may be arranged so as to form a predetermined angle therebetween, the predetermined angle being an angle between that of an arrangement shown in B of FIG. 10 and that of an arrangement shown in C of FIG. 10.

For example, the strip-shaped member 53 and the strip-shaped member 54 may be arranged so that the strip-shaped member 53 and the strip-shaped member 54 form an angle of about 0° as illustrated in B of FIG. 10 or so that the strip-shaped member 53 and the strip-shaped member 54 form an angle of about 90°.

The angle between the strip-shaped member 53 and the strip-shaped member 54 is determined, for example, in accordance with the distance between the second end of the strip-shaped member 51 and the second end of the strip-shaped member 55 illustrated in FIG. 8.

A set of members that are connected to each other in each of the portions C14 to C16 shown in FIG. 7 are extended in the same way as the set of members connected to each other in the portion C13, that is, the strip-shaped member 53, the strip-shaped member 54, and the connecting member 62 shown in FIG. 8 are extended.

Figure 11:
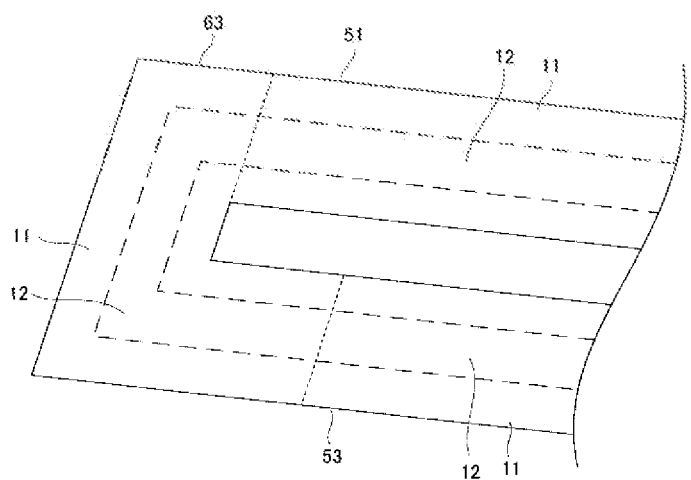
FIG. 11 illustrate an example of the process of extending the first strip-shaped member and the third strip-shaped member of the flexible printed wiring board according to the embodiment of the present invention substantially at right angles to each other.
Figure 11:
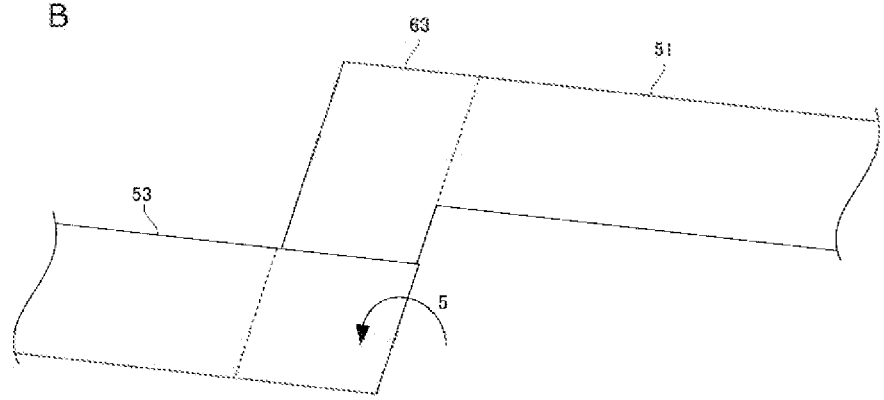
Figure 11:
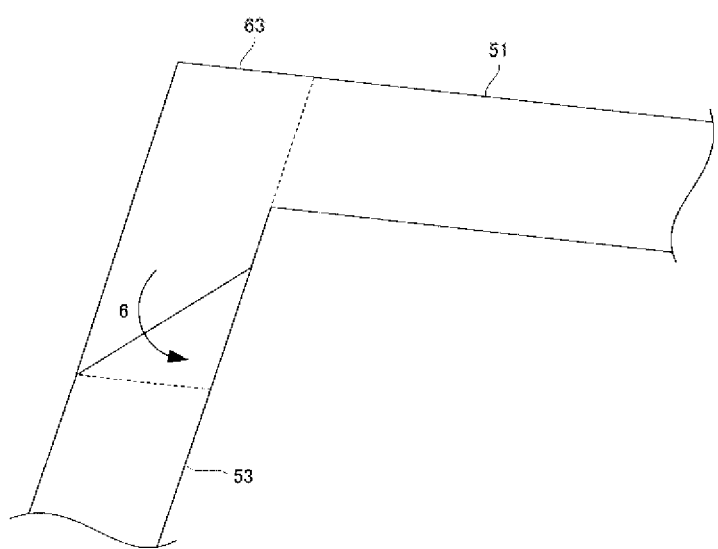

FIG. 11 illustrate an example of the process of extending the first strip-shaped member and the third strip-shaped member of the flexible printed wiring board according to the embodiment of the present invention substantially at right angles to each other.

In FIG. 11, A illustrates a state before the strip-shaped member 51 and the strip-shaped member 53 are extended substantially at right angles to each other. In FIG. 11, B illustrates a state in which the strip-shaped member 51 and the strip-shaped member 53 are being extended substantially at right angles to each other. In FIG. 11, C illustrates a state in which the strip-shaped member 51 and the strip-shaped member 53 have been extended substantially at right angles to each other. Preferably, the term "right angle" refers to an angle in the range of 90±5°.

Referring to FIG. 11, A shows that the connecting member 63 connects the second end of the strip-shaped member 51 and the second end of the strip-shaped member 53 to each other.

The connecting member 63 includes a conductive part 12 and an insulating part 11 covering the conductive part 12. The conductive part 12 of the strip-shaped member 51, the conductive part 12 of the connecting member 63, and the conductive part 12 of the strip-shaped member 53 are connected to each other in this order. Before being extended, the strip-shaped member 51 and the strip-shaped member 53 are located substantially parallel to each other.

Referring to FIG. 11, B shows that the connecting member 63 is bent in such a direction that the strip-shaped member 53 is moved away from the strip-shaped member 51 with the connecting member 63 therebetween, that is, in the direction of arrow 5.

Referring to FIG. 11, C shows that the connecting member 63 is bent in such a direction that the strip-shaped member 53 is located substantially at right angles to the strip-shaped member 51, that is, in the direction of arrow 6. Thus, when the connecting member 63 is bent, the strip-shaped member 53 is disposed substantially at right angles to the strip-shaped member 51. In other words, when the connecting member 63 is bent at a position at which the connecting member 63 is connected to the strip-shaped member 53 and the connecting member 63 is further bent so as to be folded back, the strip-shaped member 53 is disposed substantially at right angles to the strip-shaped member 51.

The strip-shaped member 51 and the strip-shaped member 53 need not be disposed substantially at right angles to each other. To be specific, the connecting member 63 may be bent so that the strip-shaped member 51 and the strip-shaped member 53 form an angle of, for example, 45°.

The angle between the strip-shaped member 51 and the strip-shaped member 53 is determined, for example, in accordance with the angle between the strip-shaped member 53 and the strip-shaped member 54 illustrated in FIG. 8. When the strip-shaped member 53 and the strip-shaped member 54 are linearly arranged in a state in which the strip-shaped member 51 and the strip-shaped member 55 are disposed parallel to each other, for example, a portion of the flexible printed wiring board 24 including the strip-shaped member 51 and the strip-shaped member 53 becomes twisted and the twisted portion becomes warped. By being bent, the connecting member 63 suppresses warping of the twisted portion, and makes the entirety of the flexible printed wiring board 24 be located stably on the same plane or substantially on the same plane.

The shape of the connecting member 63 is not limited to an L-shape shown in FIG. 8 and A of FIG. 11 as long as the connecting member 63 can connect the strip-shaped member 51 and the strip-shaped member 53 to each other and can be bent. For example, the shape of the connecting member 63 may be the same as that of the connecting member 62 shown in FIG. 8 and A of FIG. 10. In this case, the connecting member 63 may be bent in the same way as the connecting member 62 is bent.

Each set of members that are connected in each of the portions H2 to H8 shown in FIG. 7 are extended in the same way as the set of members connected in the portion H1, that is, the strip-shaped member 51, the strip-shaped member 53, and the connecting member 63 shown in FIG. 8 are extended.

Figure 12:
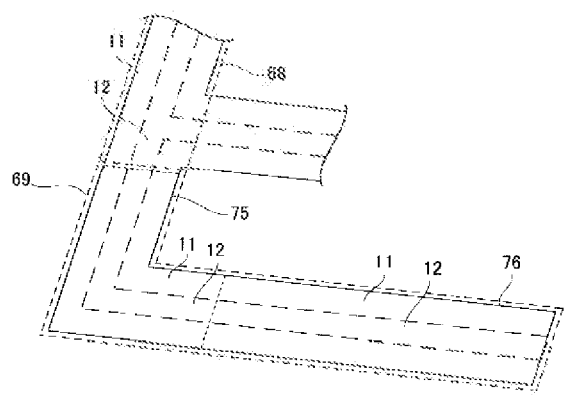
FIG. 12 illustrate the process of linearly extending an output member of the flexible printed wiring board according to the embodiment of the present invention.
Figure 12:
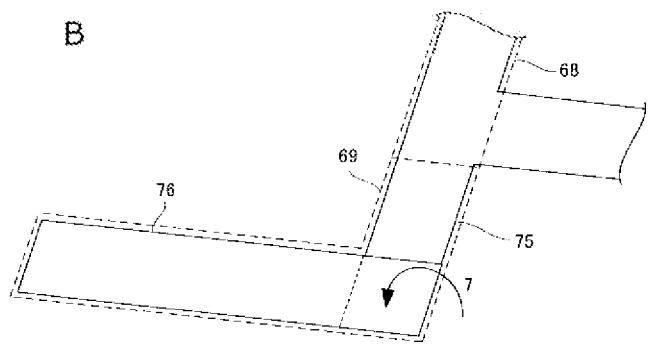
Figure 12:
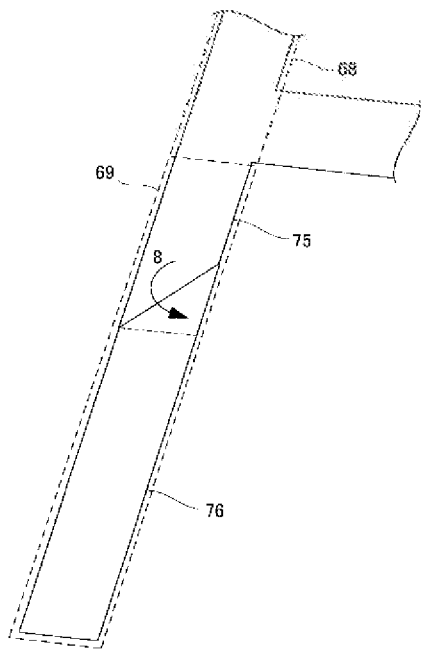

FIG. 12 illustrate the process of linearly extending an output member of the flexible printed wiring board according to the embodiment of the present invention.

In FIG. 12, A illustrates a state before the output member 69 is extended into a linear shape. In FIG. 12, B illustrates a state in which the output member 69 is being extended into a linear shape. In FIG. 12, C illustrates a state in which the output member 69 has been extended into a linear shape. An output member 70 shown in FIG. 8 is extended in the same way as the output member 69 is extended.

Referring to FIG. 12, A shows that the connecting member 75 connects the connection member 68 and the strip-shaped member 76 to each other. Thus, the output member 69 is connected to the connection member 68.

The output member 69 includes a conductive part 12 and an insulating part 11 covering the conductive part 12. The conductive part 12 of the connection member 68 and the conductive part 12 of the output member 69 are continuous with each other.

The conductive part 12 of the connection member 68, the conductive part 12 of the connecting member 75, and the conductive part 12 of the strip-shaped member 76 are connected to each other in this order.

Referring to FIG. 12, B shows that the connecting member 75 is bent in such a direction that the strip-shaped member 76 is moved away from the connecting member 75 in the opposite direction, that is, in the direction of arrow 7.

Referring to FIG. 12, C shows that the connecting member 75 is bent in such a direction that the connecting member 75 and the strip-shaped member 76 are linearly arranged, that is, in the direction of arrow 8.

The connecting member 75 and the strip-shaped member 76 need not be linearly arranged. To be specific, for example, the connecting member 75 may be bent so that the connecting member 75 and the strip-shaped member 76 form an angle of 45°.

Each of the output member 69 and the output member 70 may be configured so as to be shortened or elongated. For example, by forming the output member 69 so as to have a structure the same as that of the connection member 68, the output member 69 can be elongated by being extended.

Structure of Photovoltaic Module

Figure 13:
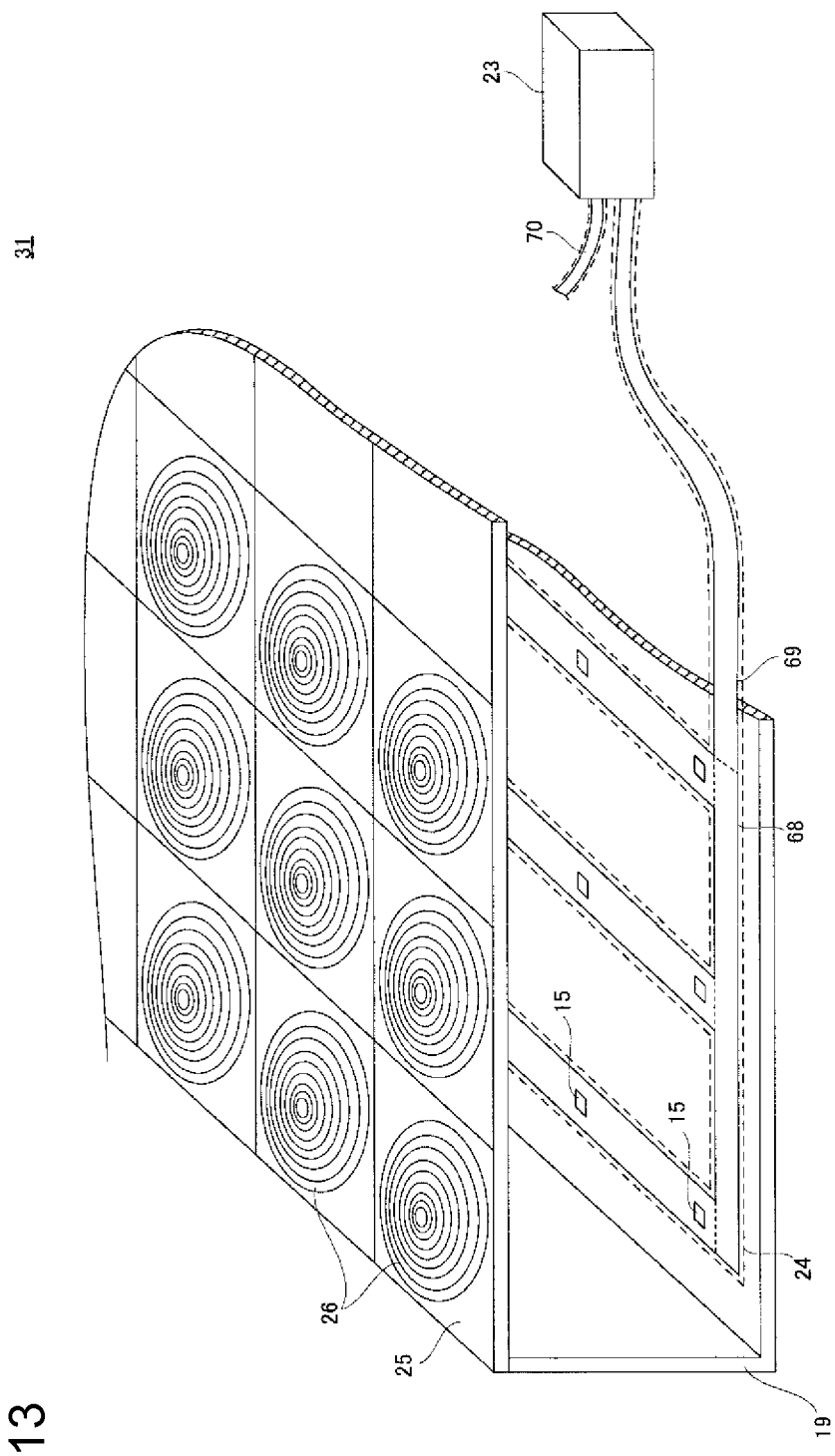
FIG. 13 illustrates the structure of a photovoltaic module according to an embodiment of the present invention.

FIG. 13 illustrates the structure of a photovoltaic module 31 according to an embodiment of the present invention.

Referring to FIG. 13, the photovoltaic module 31 differs from that of the comparative example illustrated in FIG. 1 in that it includes the flexible printed wiring board 24, instead of the plurality of FPCs 13, the two bus bars 20, and the two connection leads 22.

To be specific, the photovoltaic module 31 includes the flexible printed wiring board 24, a plurality of power generating elements 15, a housing 19, a junction box 23, and a concentrating part 25. The concentrating part 25 includes a plurality of Fresnel lenses 26.

The plurality of power generating elements 15 are mounted on the flexible printed wiring board 24 in the same way as shown in FIG. 2 and FIG. 3. To be specific, for example, the power generating elements 15 are mounted on portions P1 to P3 shown in FIG. 5 that are not bent, that is, the strip-shaped members 51, 52, 55, 56, and the like, which are shown in FIG. 8.

The flexible printed wiring board 24, on which the power generating elements 15 have been mounted, is disposed, for example, on a bottom of the housing 19. The power generating elements 15 are mounted on one of main surfaces of the flexible printed wiring board 24. Each of the power generating elements 15 is located on the optical axis of a corresponding one of the Fresnel lenses 26.

The conductive parts 12 of the flexible printed wiring board 24 connect electrodes of the power generating elements 15 to each other. To be specific, the conductive parts 12 of the portions P1 to P3 shown in FIG. 5 connect the electrodes of the power generating elements 15 to each other. To be more specific, for example, the conductive part 12 of the strip-shaped member 51, the conductive part 12 of the strip-shaped member 52, and the conductive part 12 of the connecting member 61 connect the electrodes of the power generating elements 15 to each other.

The conductive parts 12 of the portions Q1 and Q2 shown in FIG. 5 further connect sets of the power generating elements 15, which are connected to each other through the conductive parts 12 of the portions P1 to P3, to each other. To be specific, for example, the conductive parts 12 of the portions Q1 and Q2 parallelly connect the sets of power generating elements 15, which are serially connected to each other through the portions P1 to P3, to each other.

The output member 69 is used to connect the connection member 68 to another apparatus. Thus, the conductive part 12 of the portion R1 shown in FIG. 5 is continuous with the conductive part 12 of the portion Q1, and the conductive part 12 of the portion Q1 is connected to one of terminals of the junction box 23.

The conductive part 12 of the portion R2 shown is continuous with the conductive part 12 of the portion Q2, and the conductive part 12 of the portion Q2 is connected to the other terminal of the junction box 23.

Electric power generated by each of the power generating elements 15 is output through the junction box 23 to the outside of the photovoltaic module 31.

The flexible printed wiring board 24 can be used not only for the photovoltaic module 31 but also for other apparatuses.

The size of an FPC is generally limited by the specifications of manufacturing equipment, such as exposure equipment. Therefore, in order to use a long FPC, it is necessary to make an FPC having a desired length by connecting a plurality of FPCs to each other by, for example, soldering. However, connection of FPCs by soldering tends to cause a decrease in product quality and an increase in manufacturing cost.

For example, Japanese Unexamined Patent Application Publication No. 2006-5134 describes the following technology for making a long FPC without performing soldering. A flexible printed circuit board described in Japanese Unexamined Patent Application Publication No. 2006-5134 includes a continuous wiring pattern including flexible electric insulators and electroconductive members disposed between the electric insulators. The flexible printed circuit board has a slit formed in a region in which the wiring pattern is not disposed. The flexible printed circuit board is folded back at position near the slit, and thereby the length of the flexible printed circuit board becomes longer than that before being folded back.

In the photovoltaic module 31, it is necessary to equalize the distance between the power generating elements 15 mounted on the flexible printed wiring board 24 and the Fresnel lenses 26 for concentrating sunlight.

However, if, for example, the FPC described in Japanese Unexamined Patent Application Publication No. 2006-5134 were used instead of the FPC 13 in the photovoltaic module 30, the fold-back portion would be located below the FPC, and therefore it would not be possible to equalize the distance between the power generating elements 15 mounted on the FPC and the Fresnel lenses 26.

In contrast, in the flexible printed wiring board according to the embodiment of the present invention, each of the strip-shaped member 51 and the strip-shaped member 52 includes the conductive part 12 and the insulating part 11 covering the conductive part 12. The connecting member 61 includes the conductive part 12 and the insulating part 11 covering the conductive part 12, and connects the first end of the strip-shaped member 51 and the first end of the strip-shaped member 52 to each other. The conductive part 12 of the strip-shaped member 51, the conductive part 12 of the strip-shaped member 52, and the conductive part 12 of the connecting member 61 are continuous with each other. The strip-shaped member 51 and the strip-shaped member 52 are capable of being linearly arranged when the connecting member 61 is bent and first end of the strip-shaped member 51 and the first end of the strip-shaped member 52 face each other.

In the photovoltaic module according to the embodiment of the present invention, the plurality of power generating elements 15 are mounted on the flexible printed wiring board 24. Each of the strip-shaped member 51 and the strip-shaped member 52 includes the conductive part 12 and the insulating part 11 covering the conductive part 12. The connecting member 61 includes the conductive part 12 and the insulating part 11 covering the conductive part 12, and connects the first end of the strip-shaped member 51 and the first end of the strip-shaped member 52 to each other. The conductive part 12 of the strip-shaped member 51, the conductive part 12 of the strip-shaped member 52, and the conductive part 12 of the connecting member 61 are continuous with each other. The strip-shaped member 51 and the strip-shaped member 52 are capable of being linearly arranged when the connecting member 61 is bent and the first end of the strip-shaped member 51 and the first end of the strip-shaped member 52 face each other. The conductive part 12 of the strip-shaped member 51, the conductive part 12 of the strip-shaped member 52, and the conductive part 12 of the connecting member 61 electrically connect the electrodes of the power generating elements to each other.

Thus, for example, with a structure in which the strip-shaped member 51 and the strip-shaped member 52, which have been formed substantially parallel to each other, are extended into a linear shape, it is possible to make a long flexible printed wiring board without connecting FPCs to each other by soldering or the like. As a result, it is possible to reduce the cost of manufacturing a long flexible printed wiring board and to prevent a decrease in quality. Therefore, long wiring can be easily realized by using existing manufacturing equipment.

For example, by locating the connecting member 61 on the front side of the strip-shaped member 51 and the strip-shaped member 52, the entirety of the back surfaces of the strip-shaped member 51 and the strip-shaped member 52 can be disposed in contact with the bottom of the housing of the photovoltaic module. Therefore, it is possible to equalize the distance between the power generating elements, which are disposed on the front side of the strip-shaped member 51 and the strip-shaped member 52, and the Fresnel lenses, which are disposed so as to be parallel to the bottom of the housing 19. Moreover, by making the entirety of the back surfaces of the strip-shaped member 51 and the strip-shaped member 52 be in contact with the bottom of the housing of the photovoltaic module, it is possible to dissipate heat generated by sunlight in the power generating elements and to maintain high energy conversion efficiency from sunlight to electric power.

The distance between the strip-shaped member 51 and the strip-shaped member 52 can be finely adjusted while keeping the strip-shaped member 51 and the strip-shaped member 52 to be linearly arranged. Therefore, for example, it is possible to easily adjust the positions of the power generating elements mounted on the strip-shaped member 51 and the strip-shaped member 52 with those of the Fresnel lenses disposed above the power generating elements.

In the flexible printed wiring board according to the embodiment of the present invention, the connection member 68 connects the second end of the strip-shaped member 51 and the second end of the strip-shaped member 55 to each other. The connection member 68 includes the strip-shaped member 53, the strip-shaped member 54, and the connecting member 62. Each of the strip-shaped member 53 and the strip-shaped member 54 includes the conductive part 12 and the insulating part 11 covering the conductive part 12. The connecting member 62 includes the conductive part 12 and the insulating part covering the conductive part 12, and connects the first end of the strip-shaped member 53 and the first end of the strip-shaped member 54 to each other. The conductive part 12 of the strip-shaped member 53, the conductive part 12 of the strip-shaped member 54, the conductive part 12 of the connecting member 62, and the conductive part 12 of the strip-shaped member 51 are continuous with each other. The strip-shaped member 53 and the strip-shaped member 54 are capable of being linearly arranged when the connecting member 62 is bent and the first end of the strip-shaped member 53 and the first end of the strip-shaped member 54 face each other.

As described above, the second ends of the plurality of strip-shaped members 51 are connected to each other through the connection member, which is integrally formed with the strip-shaped members 51. Therefore, it is not necessary to additionally perform a soldering operation to connect the conductive parts 12 of the strip-shaped members 51 to each other. As a result, it is possible to reduce the cost of manufacturing the flexible printed wiring board and to prevent a decrease in quality.

In the flexible printed wiring board according to the embodiment of the present invention, the connection member 68 includes the connecting member 63. The connecting member 63 includes the conductive part 12 and the insulating part 11 covering the conductive part 12, and connects the second end of the strip-shaped member 51 and the second end of the strip-shaped member 53 to each other. The conductive part 12 of the strip-shaped member 51, the conductive part 12 of the connecting member 63, and the conductive part 12 of the strip-shaped member 53 are connected to each other in this order. The strip-shaped member 53 is capable of being disposed substantially at right angles to the strip-shaped member 51 when the connecting member 63 is bent.

With the structure described above, in which the connecting member 63 is employed, for example, warping of the flexible printed wiring board 24 due to twisting, which may occur when the strip-shaped member 53 and the strip-shaped member 54 are linearly arranged, is suppressed, and it is possible to locate the entirety of the flexible printed wiring board 24 stably on the same plane or substantially on the same plane.

In the flexible printed wiring board according to the embodiment of the present invention, the output member 69 includes the conductive part 12 and the insulating part 11 covering the conductive part 12. The output member 69 connects the connection member 68 to another apparatus. The conductive part 12 of the connection member 68 and the conductive part 12 of the output member 69 are continuous with each other.

With such a structure, the flexible printed wiring board 24 can be connected to another apparatus without additionally connecting lead wires. Therefore, it is possible to reduce the manufacturing cost and to prevent a decrease in quality.

The embodiment described above is exemplary and is not limiting in all respects. The scope of the present invention is represented, not by the above description, but by the claims, and it is intended that the scope encompasses all modifications within the meanings of the claims and the equivalents thereof.

The above description includes features described in the following appendices.

APPENDIX 1

A flexible printed wiring board including:

a first strip-shaped member and a second strip-shaped member each including a conductive part and an insulating part covering the conductive part; and a first connecting member including a conductive part and an insulating part covering the conductive part, the first connecting member connecting a first end of the first strip-shaped member and a first end of the second strip-shaped member to each other, wherein the conductive part of the first strip-shaped member, the conductive part of the second strip-shaped member, and the conductive part of the first connecting member are continuous with each other, wherein the first strip-shaped member and the second strip-shaped member are capable of being linearly arranged when the first connecting member is bent and the first end of the first strip-shaped member and the first end of the second strip-shaped member face each other, wherein the flexible printed wiring board includes a plurality of sets of the first strip-shaped members, the second strip-shaped members, and the first connecting members, wherein the flexible printed wiring board further includes a connection member connecting second ends of the first strip-shaped members to each other, and wherein one or more power generating elements are mounted on the first strip-shaped member and the second belt-lime member.

APPENDIX 2

A photovoltaic module including:

a flexible printed wiring board; and a plurality of power generating elements mounted on the flexible printed wiring board, wherein the flexible printed wiring board includes a first strip-shaped member and a second strip-shaped member each including a conductive part and an insulating part covering the conductive part, and a first connecting member including a conductive part and an insulating part covering the conductive part, the first connecting member connecting a first end of the first strip-shaped member and a first end of the second strip-shaped member to each other, wherein the conductive part of the first strip-shaped member, the conductive part of the second strip-shaped member, and the conductive part of the first connecting member are continuous with each other, wherein the first strip-shaped member and the second strip-shaped member are capable of being linearly arranged when the first connecting member is bent and the first end of the first strip-shaped member and the first end of the second strip-shaped member face each other, wherein the flexible printed wiring board includes a plurality of sets of the first strip-shaped members, the second strip-shaped members, and the first connecting members; and a connection member connecting second ends of the first strip-shaped members to each other, wherein one or more power generating elements are mounted on the first strip-shaped member and the second belt-lime member, and the conductive part of the first strip-shaped member, and wherein the conductive part of the first strip-shaped member, the conductive part of the second strip-shaped member, and the conductive part of the first connecting member electrically connect electrodes of the power generating elements to each other.

APPENDIX 3

A flexible printed wiring board including: a first strip-shaped member and a second strip-shaped member each including a conductive part and an insulating part covering the conductive part; and a first connecting member including a conductive part and an insulating part covering the conductive part, the first connecting member connecting a first end of the first strip-shaped member and a first end of the second strip-shaped member to each other, wherein the conductive part of the first strip-shaped member, the conductive part of the second strip-shaped member, and the conductive part of the first connecting member are continuous with each other, and wherein the first connecting member is bent at a position at which the first connecting member is connected to the first end of the first strip-shaped member and at a position at the first connecting member is connected to the first end of the second strip-shaped member so that the first connecting member stands on the first strip-shaped member and the second strip-shaped member, the first connecting member is further bent at a central portion thereof so that the first end of the first strip-shaped member and the first end of the second strip-shaped member face each other, and the first strip-shaped member and the second strip-shaped member are linearly arranged.

APPENDIX 4

The flexible printed wiring board including:

a plurality of sets of the first strip-shaped members, the second strip-shaped members, and the first connecting members; and a connection member connecting second ends of the first strip-shaped members to each other, wherein the connection member includes a third strip-shaped member and a fourth strip-shaped member each including a conductive part and an insulating part covering the conductive part, and a second connecting member including a conductive part and an insulating part covering the conductive part, the second connecting member connecting a first end of the third strip-shaped member and a first end of the fourth strip-shaped member to each other, wherein the conductive part of the third strip-shaped member, the conductive part of the fourth strip-shaped member, the conductive part of the second connecting member, and the conductive part of the first strip-shaped member are continuous with each other, and wherein the first connecting member is bent at a position at which the first connecting member is connected to the first end of the first strip-shaped member and at a position at the first connecting member is connected to the first end of the second strip-shaped member so that the first connecting member stands on the first strip-shaped member and the second strip-shaped member, the first connecting member is further bent at a central portion thereof so that the first end of the first strip-shaped member and the first end of the second strip-shaped member face each other, and the first strip-shaped member and the second strip-shaped member are linearly arranged.

APPENDIX 5

The flexible printed wiring board further including:
a third connecting member including a conductive part and an insulating part covering the conductive part, the third connecting member connecting a second end of the first strip-shaped member and a second end of the third strip-shaped member to each other,
wherein the conductive part of the first strip-shaped member, the conductive part the third connecting member, and the conductive part of the third strip-shaped member are connected to each other in this order, and
wherein, when the third connecting member is bent at a position at which the third connecting member is connected to the second end of the third strip-shaped member and the third connecting member is further bent so as to be folded back, the third strip-shaped member is disposed substantially at right angles to the first strip-shaped member.

APPENDIX 6

A photovoltaic module including:
a flexible printed wiring board; and
a plurality of power generating elements mounted on the flexible printed wiring board,
wherein the flexible printed wiring board includes
a first strip-shaped member and a second strip-shaped member each including a conductive part and an insulating part covering the conductive part, and
a first connecting member including a conductive part and an insulating part covering the conductive part, the first connecting member connecting a first end of the first strip-shaped member and a first end of the second strip-shaped member to each other,
wherein the conductive part of the first strip-shaped member, the conductive part of the second strip-shaped member, and the conductive part of the first connecting member are continuous with each other,
wherein the first connecting member is bent at a position at which the first connecting member is connected to the first end of the first strip-shaped member and at a position at the first connecting member is connected to the first end of the second strip-shaped member so that the first connecting member stands on the first strip-shaped member and the second strip-shaped member, the first connecting member is further bent at a central portion thereof so that the first end of the first strip-shaped member and the first end of the second strip-shaped member face each other, and the first strip-shaped member and the second strip-shaped member are linearly arranged, and
wherein the conductive part of the first strip-shaped member, the conductive part of the second strip-shaped member, and the conductive part of the first connecting member electrically connect electrodes of the power generating elements to each other.

What is claimed is:
1. A flexible printed wiring board comprising:
a first strip-shaped member and a second strip-shaped member each including a conductive part and an insulating part covering the conductive part; and
a first connecting member including a conductive part and an insulating part covering the conductive part, the first connecting member connecting a first end of the first strip-shaped member and a first end of the second strip-shaped member to each other,
wherein the conductive part of the first strip-shaped member, the conductive part of the second strip-shaped member, and the conductive part of the first connecting member are continuous with each other and form a U-shape with the conductive part of the first connecting member forming a bottom of the U-shape, and
wherein the first connecting member is bendable to linearly arrange the first strip-shaped member and the second strip-shaped member in line and to have the first end of the first strip-shaped member and the first end of the second strip-shaped member facing each other.

2. The flexible printed wiring board according to claim 1, comprising:
a plurality of sets of the first strip-shaped members, the second strip-shaped members, and the first connecting members; and
a connection member connecting second ends of the first strip-shaped members to each other,
wherein the connection member includes
a third strip-shaped member and a fourth strip-shaped member each including a conductive part and an insulating part covering the conductive part, and
a second connecting member including a conductive part and an insulating part covering the conductive part, the second connecting member connecting a first end of the third strip-shaped member and a first end of the fourth strip-shaped member to each other,
wherein the conductive part of the third strip-shaped member, the conductive part of the fourth strip-shaped member, the conductive part of the second connecting member, and the conductive part of the first strip-shaped member are continuous with each other, and
wherein the second connecting member is bendable to linearly arrange the third strip-shaped member and the fourth strip-shaped member in line and to have the first end of the third strip-shaped member and the first end of the fourth strip-shaped member facing each other.

3. The flexible printed wiring board according to claim 2, wherein the connection member further includes
a third connecting member including a conductive part and an insulating part covering the conductive part, the third connecting member connecting a second end of the first strip-shaped member and a second end of the third strip-shaped member to each other,
wherein the conductive part of the first strip-shaped member, the conductive part the third connecting member, and the conductive part of the third strip-shaped member are connected to each other in this order, and
wherein the third strip-shaped member is bendable to dispose the third strip-shaped member substantially at right angles to the first strip-shaped member.

4. The flexible printed wiring board according to claim 2, further comprising:
an output member for connecting the connection member to another apparatus, the output member including a conductive part and an insulating part covering the conductive part,
wherein a conductive part of the connection member and the conductive part of the output member are continuous with each other.

5. A photovoltaic module comprising:
a flexible printed wiring board; and a plurality of power generating elements mounted on the flexible printed wiring board, wherein the flexible printed wiring board includes a first strip-shaped member and a second strip-shaped member each including a conductive part and an insulating part covering the conductive part, and a first connecting member including a conductive part and an insulating part covering the conductive part, the first connecting member connecting a first end of the first strip-shaped member and a first end of the second strip-shaped member to each other, wherein the conductive part of the first strip-shaped member, the conductive part of the second strip-shaped member, and the conductive part of the first connecting member are continuous with each other and form a U-shape with the conductive part of the first connecting member forming a bottom of the U-shape, wherein the first connecting member is bendable to linearly arrange the first strip-shaped member and the second strip-shaped member in line and to have the first end of the first strip-shaped member and the first end of the second strip-shaped member facing each other, and wherein the conductive part of the first strip-shaped member, the conductive part of the second strip-shaped member, and the conductive part of the first connecting member electrically connect electrodes of the power generating elements to each other.

* * * * *